United States Patent
Harris et al.

(10) Patent No.: US 8,946,726 B2
(45) Date of Patent: *Feb. 3, 2015

(54) GRID-UMOSFET WITH ELECTRIC FIELD SHIELDING OF GATE OXIDE

(71) Applicant: Cree, Inc., Durham, NC (US)

(72) Inventors: Christopher Harris, Taby (SE); Andrei Konstantinov, Sollentuna (SE); Jan-Olov Svedberg, Jarfalla (SE)

(73) Assignee: Cree, Inc., Durham, NC (US)

( * ) Notice: Subject to any disclaimer, the term of this patent is extended or adjusted under 35 U.S.C. 154(b) by 59 days.

This patent is subject to a terminal disclaimer.

(21) Appl. No.: 13/847,564

(22) Filed: Mar. 20, 2013

(65) Prior Publication Data

US 2013/0270577 A1 Oct. 17, 2013

Related U.S. Application Data

(63) Continuation of application No. 11/855,595, filed on Sep. 14, 2007, now Pat. No. 8,421,148.

(51) Int. Cl.
| | |
|---|---|
| *H01L 29/15* | (2006.01) |
| *H01L 29/78* | (2006.01) |
| *H01L 29/06* | (2006.01) |
| *H01L 29/10* | (2006.01) |
| *H01L 29/16* | (2006.01) |
| *H01L 29/66* | (2006.01) |

(Continued)

(52) U.S. Cl.
CPC ........ *H01L 29/7827* (2013.01); *H01L 29/0623* (2013.01); *H01L 29/1095* (2013.01); *H01L 29/1608* (2013.01); *H01L 29/66068* (2013.01); *H01L 29/66727* (2013.01); *H01L 29/66734* (2013.01); *H01L 29/7813* (2013.01); *H01L 29/2003* (2013.01); *H01L 29/41741* (2013.01); *H01L 29/41766* (2013.01); *H01L 29/4238* (2013.01); *H01L 29/45* (2013.01)
USPC ............................................... 257/77; 438/33

(58) Field of Classification Search
CPC ...................... H01L 29/1608; H01L 29/66068
USPC ............................................... 257/77; 438/33
See application file for complete search history.

(56) References Cited

U.S. PATENT DOCUMENTS

| | | |
|---|---|---|
| 4,839,702 A | 6/1989 | Grinberg et al. |
| 5,283,201 A | 2/1994 | Tsang et al. |

(Continued)

FOREIGN PATENT DOCUMENTS

WO 9736313 A2 10/1997

OTHER PUBLICATIONS

Harada, Shinsuke et al., "8.5-mΩ•cm2 600-V Double-Epitaxial MOSFETs in 4H-SiC", IEEE Electron Device Letters, vol. 25, No. 5, May 2004, pp. 292-294.

(Continued)

*Primary Examiner* — Jami M Valentine
(74) *Attorney, Agent, or Firm* — Withrow & Terranova, P.L.L.C.

(57) ABSTRACT

A trench metal oxide semiconductor field effect transistor or UMOSFET, includes a buried region that extends beneath the trench and beyond a corner of the trench. The buried region is tied to a source potential of the UMOSFET, and splits the potential realized across the structure. This effectively shields the electric field from the corners of the trench to reduce gate oxide stress, and resultantly improves device performance and reliability.

22 Claims, 8 Drawing Sheets

(51) Int. Cl.
H01L 29/20 (2006.01)
H01L 29/417 (2006.01)
H01L 29/423 (2006.01)
H01L 29/45 (2006.01)

(56) References Cited

U.S. PATENT DOCUMENTS

| | | | |
|---|---|---|---|
| 5,637,898 A | 6/1997 | Baliga | |
| 5,814,859 A | 9/1998 | Ghezzo et al. | |
| 5,831,288 A | 11/1998 | Singh et al. | |
| 5,895,939 A | 4/1999 | Ueno | |
| 5,915,180 A | 6/1999 | Hara et al. | |
| 5,923,051 A | 7/1999 | Harris et al. | |
| 6,091,108 A | 7/2000 | Harris et al. | |
| 6,146,926 A | 11/2000 | Bhatnagar et al. | |
| 6,168,695 B1 | 1/2001 | Woodruff et al. | |
| 6,180,958 B1 | 1/2001 | Cooper, Jr. | |
| 6,259,134 B1 | 7/2001 | Amaratunga et al. | |
| 6,600,192 B1 | 7/2003 | Sugawara et al. | |
| 7,033,891 B2 | 4/2006 | Wilson et al. | |
| 7,186,618 B2 | 3/2007 | Pölzl et al. | |
| 7,586,151 B2 | 9/2009 | Takaya et al. | |
| 2002/0056871 A1 | 5/2002 | Kocon et al. | |
| 2002/0139992 A1 | 10/2002 | Kumar et al. | |
| 2003/0042538 A1 | 3/2003 | Kumar et al. | |
| 2003/0042555 A1 | 3/2003 | Kitada et al. | |
| 2004/0070013 A1 | 4/2004 | Yamaguchi et al. | |
| 2006/0194392 A1 | 8/2006 | Nagaoka | |
| 2006/0199365 A1 | 9/2006 | Wilner | |
| 2007/0190728 A1 | 8/2007 | Sreekantham et al. | |
| 2007/0262324 A1 | 11/2007 | Kaneko | |
| 2008/0179662 A1 | 7/2008 | Hshieh | |
| 2009/0072241 A1* | 3/2009 | Harris et al. | 257/77 |
| 2012/0235164 A1* | 9/2012 | Zhang et al. | 257/77 |

OTHER PUBLICATIONS

Li, Y. et al., "High Voltage (3 kV) USMOSFETs in 4H-SiC", IEEE Transactions on Electron Devices, vol. 49, No. 6, Jun. 2002, pp. 972-975.
Singh, Ranbir et al., "Development of High-Current 4H-SiC ACCUFET", IEEE Transactions on Devices, vol. 50, No. 2, Feb. 2003, pp. 471-478.
International Preliminary Report on Patentability for PCT/US08/83210, mailed Apr. 5, 2011, 16 pages.
Non-Final Office Action for U.S. Appl. No. 11/855,595, mailed Dec. 9, 2009, 23 pages.
Final Office Action for U.S. Appl. No. 11/855,595, mailed Jun. 25, 2010, 25 pages.
Advisory Action for U.S. Appl. No. 11/855,595, mailed Sep. 17, 2010, 3 pages.
Non-Final Office Action for U.S. Appl. No. 11/855,595, mailed Feb. 10, 2011, 28 pages.
Final Office Action for U.S. Appl. No. 11/855,595, mailed Jun. 28, 2011, 31 pages.
Advisory Action for U.S. Appl. No. 11/855,595, mailed Sep. 12, 2011, 4 pages.
Non-Final Office Action for U.S. Appl. No. 11/855,595, mailed May 23, 2012, 23 pages.
Notice of Allowance for U.S. Appl. No. 11/855,595, mailed Dec. 12, 2012, 8 pages.
Restriction Requirement for U.S. Appl. No. 11/949,221, mailed Dec. 31, 2009, 7 pages.
Non-Final Office Action for U.S. Appl. No. 11/949,221, mailed May 14, 2010, 8 pages.
Final Office Action for U.S. Appl. No. 11/949,221, mailed Oct. 29, 2010, 9 pages.
Notice of Allowance for U.S. Appl. No. 11/949,221, mailed Feb. 18, 2011, 8 pages.
Notice of Allowance for U.S. Appl. No. 11/949,221, mailed Jun. 23, 2011, 7 pages.
Notice of Allowance for U.S. Appl. No. 11/949,221, mailed Aug. 31, 2011, 7 pages.

* cited by examiner

GRID-UMOSFET WITH ELECTRIC FIELD SHIELDING OF GATE OXIDE

RELATED APPLICATIONS

The present application is a continuation of U.S. patent application Ser. No. 11/855,595, filed Sep. 14, 2007, entitled "GRID-UMOSFET WITH ELECTRIC FIELD SHIELDING OF GATE OXIDE," the disclosure of which is hereby incorporated herein by reference in its entirety.

STATEMENT OF GOVERNMENT INTEREST

The present invention was developed with Government support under contract number FA8650-04-2-2410 awarded by the U.S. Air Force. The Government has certain rights in this invention.

BACKGROUND OF THE INVENTION

1. Field of the Invention

The present invention relates to trench MOSFETs, or so-called UMOSFETs, and methods of making such trench MOSFETs, and more particularly the present invention relates to shielding the gate oxide of trench MOSFETs from high electric fields.

2. Description of the Background Art

Trench MOSFETs (metal oxide semiconductor field effect transistors), or so-called UMOSFETs, are used in high power electronic applications, and typically may be made of silicon or silicon-carbide (SiC). A problem with such devices is that the electric field created in the structure becomes increased or elevated at the bottom corners of the trench. Such increased or elevated electric field stresses the oxide near the corner of the device, resulting in poor device performance and/or device failure. A conventional solution to this problem is to increase the thickness of the gate oxide at the corner of the trench. This approach however does not decrease the electric field present at the corner of the trench, and also can lead to problems with the threshold voltage of the device. Thus, a key concern regarding trench MOSFET design is the reduction of the electric field present at the bottom corners of the trench so as to maintain stable operation of the device.

SUMMARY OF THE INVENTION

In accordance with a first embodiment, a semiconductor device includes in combination a semiconductor device including a substrate of a first conductivity type; a drift layer of the first conductivity type over the substrate; a channel layer of a second conductivity type on the drift layer, the second conductivity type opposite the first conductivity type; a source layer of the first conductivity type on the channel layer; a source contact extending on the source layer, a trench extending through the source layer and the channel layer, and into the drift layer, so that a bottom of the trench is within the drift layer; a gate insulating layer on sidewalls and the bottom of the trench; a gate within the trench on the gate insulating layer; a buried region of the second conductivity type within the drift layer, the buried region extending laterally underneath the trench and beyond a corner of the trench, so that a shallow region of the drift layer is between the bottom of the trench and the buried region; and a conductive via through the source layer, the channel layer and the drift layer, electrically connecting the source contact to the buried region.

In accordance with another embodiment, a grid UMOSFET includes in combination a substrate of a first conductivity type; a drift layer of the first conductivity type over the substrate; a channel layer of a second conductivity type on the drift layer, the second conductivity type opposite the first conductivity type; a source layer of the first conductivity type on the channel layer; a source contact having a plurality of source contact fingers extending on the source layer substantially parallel with respect to each other; a plurality of trenches extending substantially parallel with respect to the source contact fingers, and through the source layer and the channel layer, into the drift layer, so that bottoms of the trenches are within the drift layer; gate insulating layers on sidewalls and the bottoms of the trenches; a plurality of gates respectively within the trenches on the gate insulating layers; a plurality of buried regions of the second conductivity type within the drift layer, the buried regions respectively extending laterally underneath the trenches and beyond corners of the trenches, so that shallow regions of the drift layer are between the bottoms of the trenches and the buried regions; and conductive vias through the source layer, the channel layer and the drift layer, electrically connecting the source contact to the buried regions.

In accordance with a further embodiment, a semiconductor device includes in combination a substrate; a plurality of semiconductor layers over the substrate, the semiconductor layers including a drift layer, a channel layer on the drift layer, and a source layer on the channel layer; a trench MOSFET disposed within the semiconductor layers; and a long channel JFET including a buried region within the drift layer, the buried region extending laterally underneath the trench MOSFET and beyond a peripheral side edge of the trench MOSFET, so that a shallow region of the drift layer is between the trench MOSFET and the buried region, the buried region of the long channel JFET is electrically coupled to a source potential applied to the source layer of the trench MOSFET.

BRIEF DESCRIPTION OF THE DRAWINGS

The above and other objects and features of the present invention will become apparent from the following description of the preferred embodiments made in connection with the accompanying drawings, in which.

DETAILED DESCRIPTION OF THE PREFERRED EMBODIMENT

Figure 1:
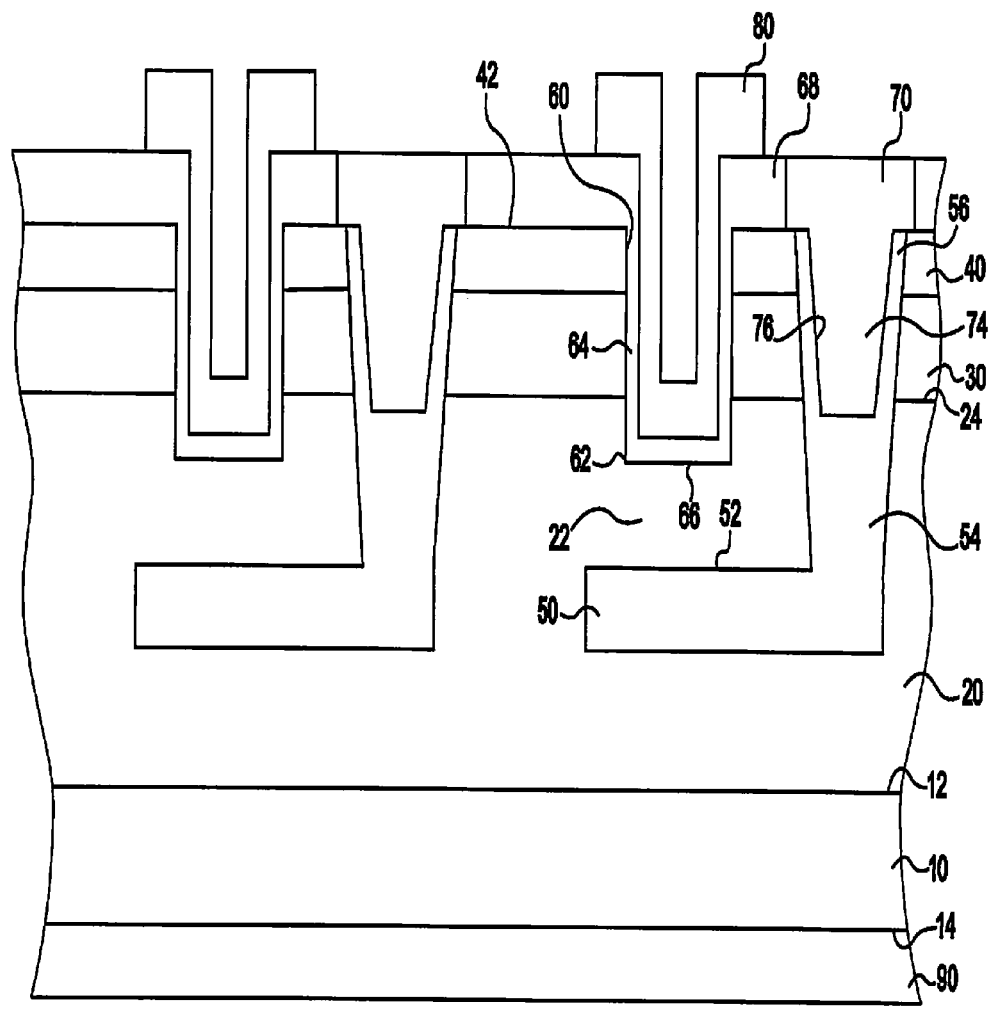
FIG. 1 illustrates a cross-section of a structure of an embodiment along sectional line 1-1 shown in FIG. 2.

The present invention will now be described more fully hereinafter with reference to the accompanying drawings, in which preferred embodiments of the Invention are shown. This invention may however be embodied in many different forms and should not be construed as limited to the embodiments set forth herein. Rather, the embodiments as described are provided so that this disclosure will be thorough and complete, and will fully convey the concept of the invention to those skilled in the art. In the drawings, the shape and thickness of the elements and layers may be exaggerated for clarity, and are not necessarily drawn to scale. Also, like reference numbers are used to refer to like elements throughout the application. Description of well known methods and materials are omitted.

Figure 2:
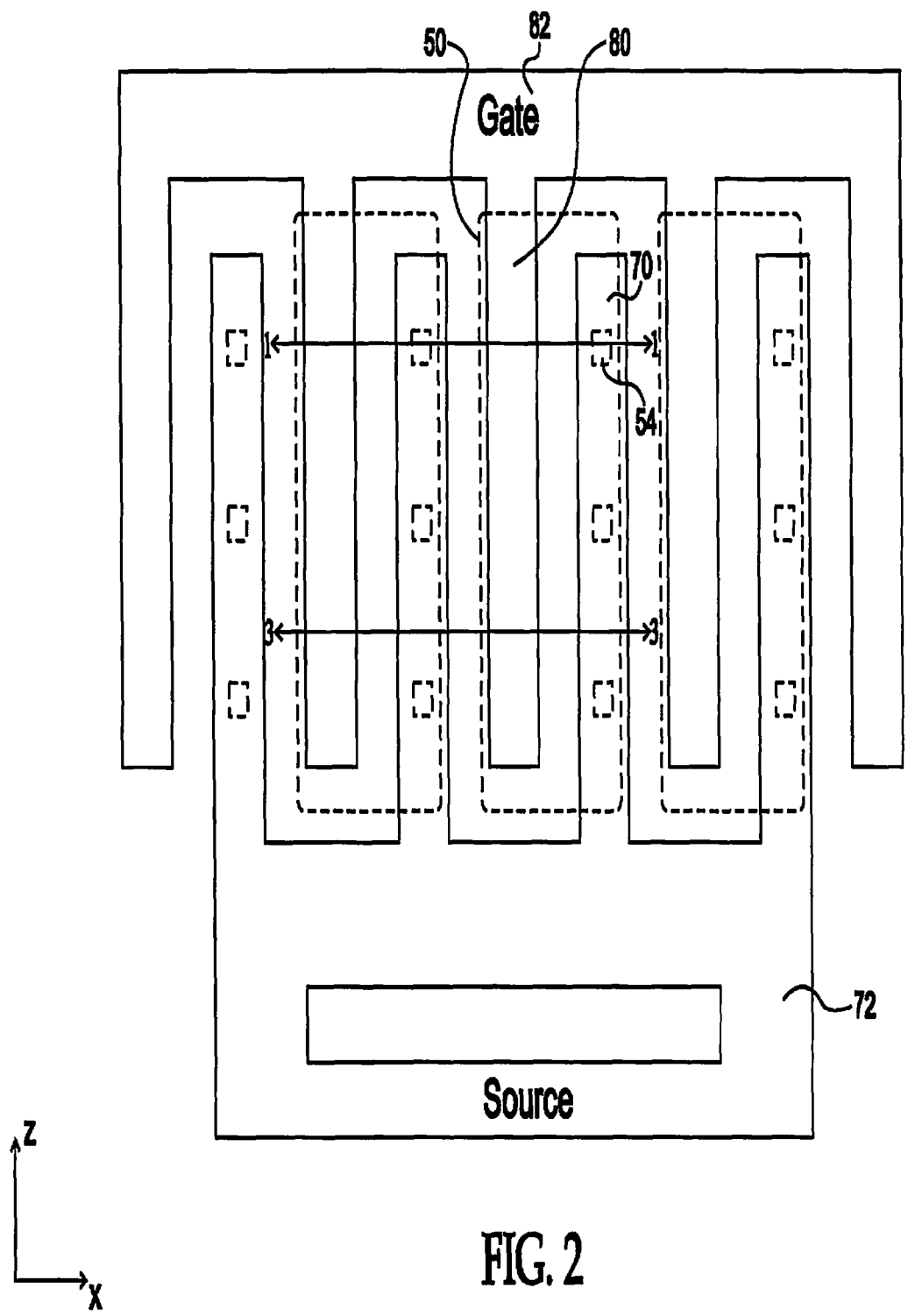
FIG. 2 illustrates a top layout view of the structure shown in FIG. 1.
Figure 3:
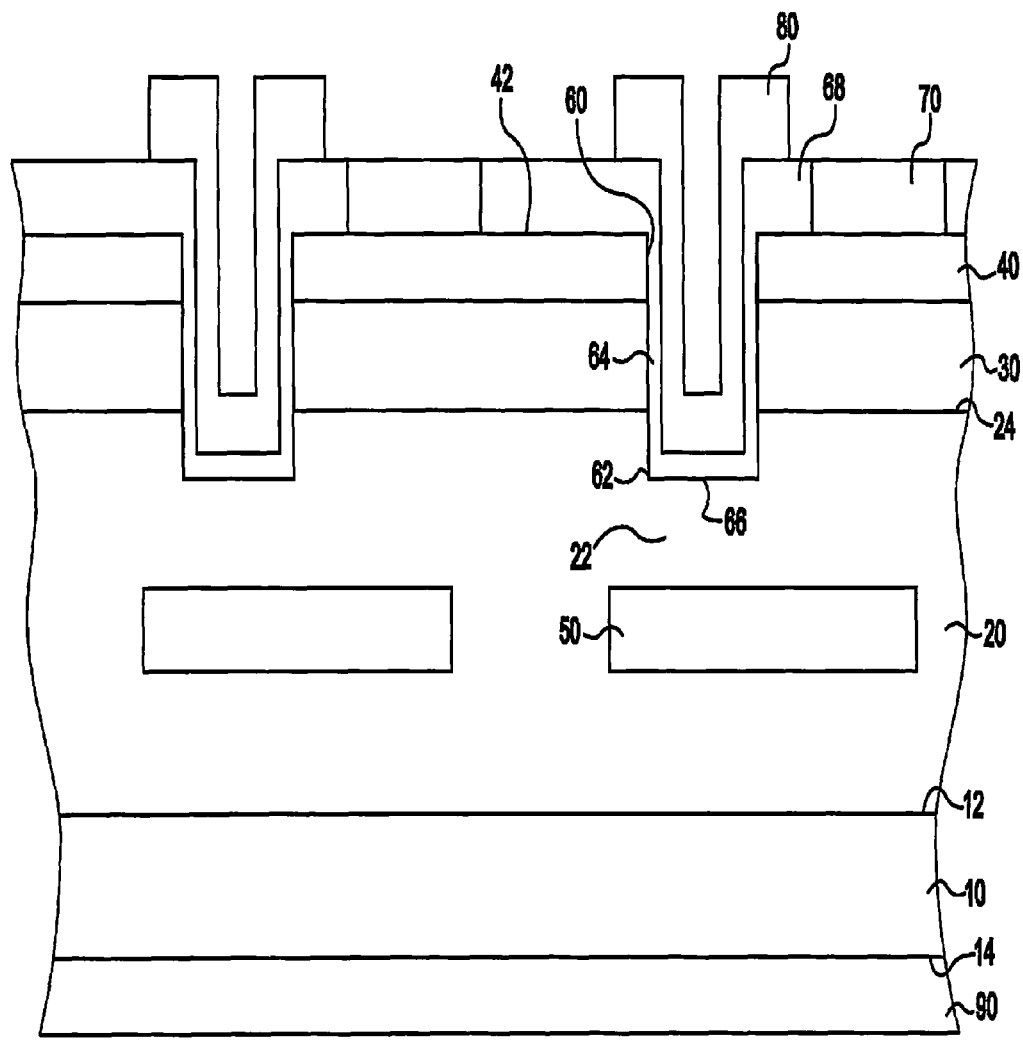
FIG. 3 illustrates a cross-section of the structure along sectional line 3-3 shown in FIG. 2.

FIG. 1 is a cross-sectional view and FIG. 2 is a top layout view of a semiconductor device of an embodiment of the present invention. The cross-sectional view in FIG. 1 is taken along sectional line 1-1 shown in FIG. 2. Also, FIG. 3 is a further cross-sectional view of the semiconductor device taken along sectional line 3-3 shown in FIG. 2.

As shown in FIG. 1, substrate 10 includes a first main surface 12, and a second main surface 14 opposing first main surface 12. First and second main surfaces 12 and 14 may be characterized as front and back sides of substrate 10, whereby devices are disposed on or over first main surface 12. Substrate 10 is silicon carbide (SIC) having n-type conductivity, and may have a thickness of about 300 to 500 microns, or about 400 microns. Substrate 10 however should not necessarily be limited as silicon carbide, or as having n-type conductivity, but may be other materials such as silicon or GaN. Moreover, substrate 10 should not necessarily be limited as a single layer of silicon carbide or other substrate material, but may in general be a growth substrate with other intermediate epitaxial layers grown thereon.

As further shown in FIG. 1, n-type conductivity drift layer 20 is disposed on or over first main surface 12 of substrate 10, p-type conductivity channel layer 30 is disposed on drift layer 20, and n$^+$-type conductivity source layer 40 is disposed on channel layer 30. Drift layer 20, channel layer 30 and source layer 40 may be epitaxially grown layers of silicon carbide. In the alternative, drift layer 20, channel layer 30 and source layer 40 may be silicon or other semiconductor layers such as GaN. Drift layer 20 may have a thickness of about at least 5 µm. Channel layer 30 and source layer 40 may respectively have thicknesses of about at least 0.2 µm and 0.3 µm. It should however be understood that the above noted thicknesses are merely exemplary, and that layer thickness may be appropriately selected in view of relevant design constraints and parameters such as blocking voltage. Also, in this embodiment drift layer 20, channel layer 30 and source layer 40 are 4H crystal type layers of silicon carbide, whereby the top faces of each layer are the Si-face.

As also shown in FIG. 1, trench 60 is disposed as extending from first main or upper surface 42 of source layer 40, through source layer 40 and channel layer 30, into drift layer 20. Trench bottom or floor 66 and trench corner 62 are disposed within drift layer 20. The sidewalls of trench 60 are exposed surfaces of source layer 40, channel layer 30 and drift layer 20. Trench 60 may have a depth from upper surface 42 of source layer 40 to trench bottom 66 of about 1 µm. Gate insulator 64, which is typically silicon dioxide, is deposited conformally within trench 60 to cover trench bottom 66 and the trench sidewalls, and may have a thickness of about 50 nm. Alternatively gate insulator 64 may be formed by a combination of very thin thermally grown oxide, followed by a thinner conformal deposited oxide. Oxide layer 68 is also shown as overlying upper surface 42 of source layer 40, and may have a thickness in a range of about 50 nm. Gate contact 80 is disposed on gate insulator 64 within trench 60, and also on oxide layer 68 above a periphery of trench 60. It should be understood that taken together, gate contact 80, gate insulator 64, drift layer 20, channel layer 30 and source layer 40 constitute a trench MOSFET or UMOSFET, which enables control of vertical current flow along the y-direction across an inversion layer within channel region 30, as will be subsequently described. It should also be understood that the above noted description, and the description that follows pertaining to the UMOSFET shown in FIG. 1, applies to the other UMOSFETs evident in FIG. 2.

The device structure shown in FIG. 1 also includes buried region 50 within drift layer 20. Buried region 50 extends laterally along the x-direction from an area peripheral a first side (the right side in FIG. 1) of trench 60, underneath trench 60, and substantially beyond corner 62 of trench 60 to an area peripheral a second side (the left side of FIG. 1) of trench 60. The upper surface 52 of buried region 50 may be about 1 µm below upper surface 24 of drift layer 20. A shallow region 22 of drift layer 20, having a thickness in a range of about 1 µm, is thus sandwiched between trench bottom 66 of trench 60 and upper surface 52 of buried region 50. In this description, buried region 50 has p-type conductivity.

As further shown, source contact 70 is electrically connected to buried region 50 by conductive via 54, which also has p-type conductivity. Conductive via 54 extends from upper surface 42 of source layer 40, within source layer 40, channel layer 30 and drift layer 20, to thus contact buried region 50. Source contact 70 extends along top surface 42 of source layer 40, and includes embedded contact portion 74 that extends into contact trench 76 formed in a central region of conductive via 54. Embedded contact portion 74 of source contact 70 is separated from source layer 40, channel layer 30 and drift layer 20 by narrow section 56 of conductive via 54, which is p-type conductivity material. Source contact 70 may be a metal such as Ni, a metal stack such as Ni/Al, or a metal alloy such as TiW. The device as completed includes drain contact 90 as disposed on second main or backside surface 14 of substrate 10. Drain contact 90 may be a metal such as those used for source contact 70.

As shown in the top layout view of FIG. 2, gate contacts 80 and source contacts 70 are respectively arranged in an interdigitated pattern of gate contact fingers and source contact fingers. That is, main gate contact 82 includes multiple gate contact fingers 80 (which may hereinafter be referred to as gate contacts), and main source contact 72 includes multiple source contact fingers 70 (which may hereinafter be referred to as source contacts). Gate contacts 80 and source contacts 70 extend substantially parallel with respect to each other along the z-direction. Trenches 60 also extend substantially along the z-direction, whereby gate insulator 64 and gate contacts 80 are disposed within and along the length of trenches 60. Multiple buried regions 50 are shown by dotted lines in FIG. 2, and are respectively disposed under the gate contact 80/source contact 70 pairs. As may be appreciated in view of FIG. 2, each buried region 50 extends underneath a corresponding trench 60 (not shown) along the x-direction from the vicinity of source contact 70 to substantially beyond the corner of the corresponding trench. Buried regions 50 are disposed in a grid-like manner, and also extend in the z-direction under the trenches. Conductive vias 54 indicated by dotted lines are beneath source contacts 70, and are spaced apart from each other along the z-direction.

As emphasized previously, the cross-sectional view of the semiconductor device shown in FIG. 1 is along section line 1-1 in FIG. 2, and thus illustrates in cross-section embedded contact portion 74 of source contact 70, and conductive via 54. In contrast, the cross-sectional view of the semiconductor device shown in FIG. 3 is along sectional line 3-3, and thus illustrates in cross-section source contact 70, but does not show embedded contact portion 74 and conductive via 54.

It should be understood that even though only four source contact fingers 70 and five gate contact fingers 80 are shown in FIG. 2, the number of respective source and gate contact fingers should not be limited in number as shown. Likewise, the number of buried regions 50, and the number of conductive vias 54 along source contacts 70, should not be limited as shown. Such a grid UMOSFET device may include various multiple contact fingers and vias within the spirit and scope of the invention. Also, it should be understood that the shape of main source contact 72 and main gate contact 82, the shape of buried regions 50, and the distances between source contact fingers 70 and gate contact fingers 80 may be exaggerated to further understanding. Also, like reference numerals are used in FIG. 3, and description of the various structural elements of FIG. 3 are omitted for the sake of brevity.

Operation of the semiconductor device of this embodiment will now be described with reference to FIGS. 1-3. Upon application of a positive potential to gate contact 80 of the UMOSFET shown in FIG. 1, an inversion layer is created in channel (base) layer 30 at the interface between channel layer 30 and gate insulator 64, at the sidewall of trench 60. The inversion layer carries current from source layer 40 to drift layer 20, and the current further flows through substrate 10 out to drain contact 90. The inversion layer is generated at both sides of trench 60 within channel layer 30, so that current flows from source layer 40 through channel layer 30 along both the left and right sides of trench 60 in FIG. 1. The current from the inversion layer on the right side of trench 60 in FIG. 1 flows through shallow region 22 of drift layer 20, and together with the current from the inversion layer on the left side of trench 60, flows along buried region 50 out to drain contact 90. During such normal ON-state as thus described, there is minimal potential drop within the device and the associated electric field is minimal. Incidentally, it should be understood that a voltage applied to the gate results in an associated electric field across gate insulator 64, and that a large gate voltage or a gate insulator that is too thin will result in excessive electric field at the gate insulator, and subsequent device failure.

To turn off the UMOSFET in FIG. 1, the potential as applied to gate contact 80 is changed to ground potential (0 volts), or to a negative voltage depending on device operation parameters. As a result, electrons are not attracted to the interface between channel layer 30 and gate insulator 64 along the sidewall of trench 60. The inversion layer within channel region layer 30 thus no longer exists, and a blocking pn junction is formed at channel layer 30. The channel layer 30 thus blocks voltage across the device, and the vertical flow of current across channel layer 30 stops.

In conventional UMOSFET structures without buried region 50 and conductive via 54, under such conditions when the device Is in a voltage blocking state immediately after being turned off, a large potential is present at the drain contact and a relatively low or zero potential is present at the source contact. Under such conditions, a high electric field is concentrated at the corners of the trench, and this stresses the gate oxide within the trench, resulting in poor device performance and/or device failure of the conventional UMOSFET.

In the semiconductor device of the embodiment of FIG. 1 of the present application, buried region 50 limits the electric field that penetrates to the corners of trench 60 of the UMOSFET. That is, by incorporating buried region 50 within drift layer 20, shallow region 22 of drift layer 20 under trench 60 essentially serves as a long channel. This part of the device structure including buried region 50 and shallow region 22 can be characterized as a long-channel JFET (junction field effect transistor), that effectively shields trench 60 by reducing the strength of the electric field that concentrates at corners 62 of trench 60.

In greater detail and as described with reference to FIG. 1, at trench corner 62 in particular, the UMOSFET transitions from an ON state with steady flow of electrons and very little potential difference across the gate region, to an OFF state where suddenly the supply of electrons across channel layer 30 has been turned off. When the UMOSFET is turned off, the supply of electrons is removed. The depletion region therefore begins to extend from the p-n junction between channel layer 30 and drift layer 20, with an associated potential drop across this region. As the depletion region extends, the potential drop increases such that in the off-state, the full applied potential is dropped across the device. The geometry of the device determines how the potential drop is distributed through the device. In FIG. 1, the long-channel of the "JFET" separates the gate from the highest electric field at the junction to the buried region 50. The majority of the potential drop is taken up between buried region 50 and drain contact 90.

During the OFF state, 0 volts or lower is applied to gate contact 80, a large potential is at drain contact 90, and a low potential is at source contact 70. The device is in a blocking state. If buried region 50 was not present, there would be a large potential drop between the p-n junction (at the interface between channel layer 30 and drift layer 20) and drain contact 90. This would result in a high electric field at corner 62 of trench 60. However, because buried region 50 is present in the structure shown in FIG. 1 and is tied to the low potential at source contact 70, there is not a large potential drop between the p-n junction (channel layer 30/drift layer 20) and top surface 52 of buried region 50, and thus the electric field present at trench corner 62 is relatively low. There is a larger potential drop between the bottom of buried region 50 and drain contact 90, resulting in a relatively larger electric field there between. However, this relatively larger electric field is shielded from trench corner 62 by buried region 50. The buried region 50 can be characterized as splitting the potential realized across the structure.

It should be understood in view of FIG. 1 that the source potential at source contact 70 is shorted to channel layer 30 by conductive via 54. Source contact 70 is at lower potential than drain contact 90, and thus any p-type conductivity region such as channel layer 30 is reversed biased with respect to the potential at drain contact 90, and is therefore voltage blocking. As long as $n^+$-conductivity type source layer 40 is not in contact with n-type conductivity drift layer 20, there is no current flow during the OFF state. That is, there is no metal in contact with n-type conductivity source layer 40 and n-type conductivity drift region 20 without p-type conductivity material there between to form a blocking junction.

A method of making the semiconductor device as shown in FIGS. 1-3 will now be described with respect to FIGS. 4-8. It should be understood that this description will be presented with reference to cross-sectionals of the device taken along section line 1-1 in FIG. 2. Moreover, this description follows wherein the semiconductor layers are silicon carbide; substrate 10, drift layer 20 and source layer 40 have n-type conductivity; and channel layer 30, buried region 50 and conductive via 54 have p-type conductivity. However, one of ordinary skill should understand that the semiconductor layers may be other materials such as silicon noted previously, and that conductivity type may be reversed. The description that follows thus should not be construed as limiting.

Figure 4:
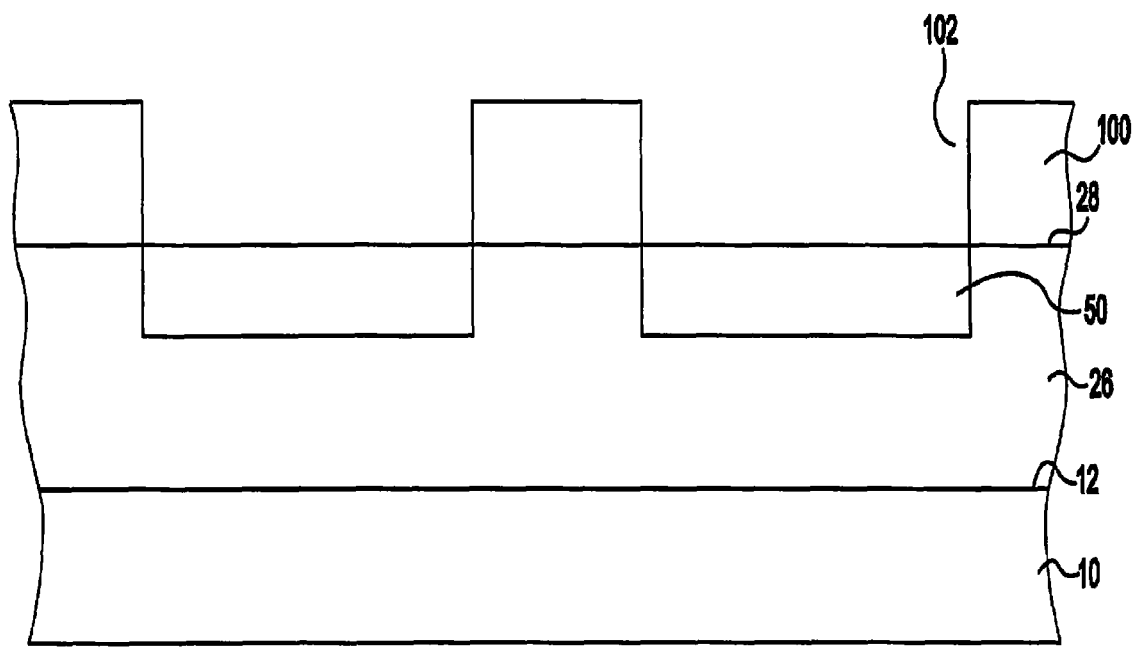
FIG. 4 illustrates a cross-section of the structure after formation of buried regions in the drift sub-layer.

With reference to FIG. 4, silicon carbide drift sub-layer 26 is first epitaxially grown on front surface 12 of substrate 10 as having n-type conductivity. Substrate 10 may have a thickness in a range of about 200 to 500 μm, and a dopant concentration in a range of about $1\times10^{14}$ cm$^{-3}$ to $1\times10^{20}$ cm$^{-3}$. Drift sub-layer 26 may have a thickness of at least about 5 μm, and a dopant concentration in a range of about $1\times10^{14}$ cm$^{-3}$ to $2\times10^{16}$ cm$^{-3}$. Drift sub-layer 26 may be epitaxially grown using well-known techniques such as Metal Organic Chemical Vapor Deposition (MOCVD). Nitrogen or phosphorous may be used as n-type dopants. Thereafter, an implantation mask 100 such as silicon dioxide is deposited using a technique such as Plasma Enhanced Chemical Vapor Deposition (PECVD), and is patterned on upper surface 28 of drift sub-layer 26 using standard photolithographic techniques as would be understood by one of ordinary skill, so as to include openings or windows 102. Buried regions 50 having p-type conductivity are thereafter formed through openings 102 in implantation mask 100 using standard ion implantation techniques. Aluminum may be used as the p-type dopant, and the concentration of buried regions 50 may be at least about $1\times10^{18}$ cm$^{-3}$. Boron or any other suitable p-type dopant may be used as an alternative. Implantation mask 100 is thereafter removed.

Figure 5:
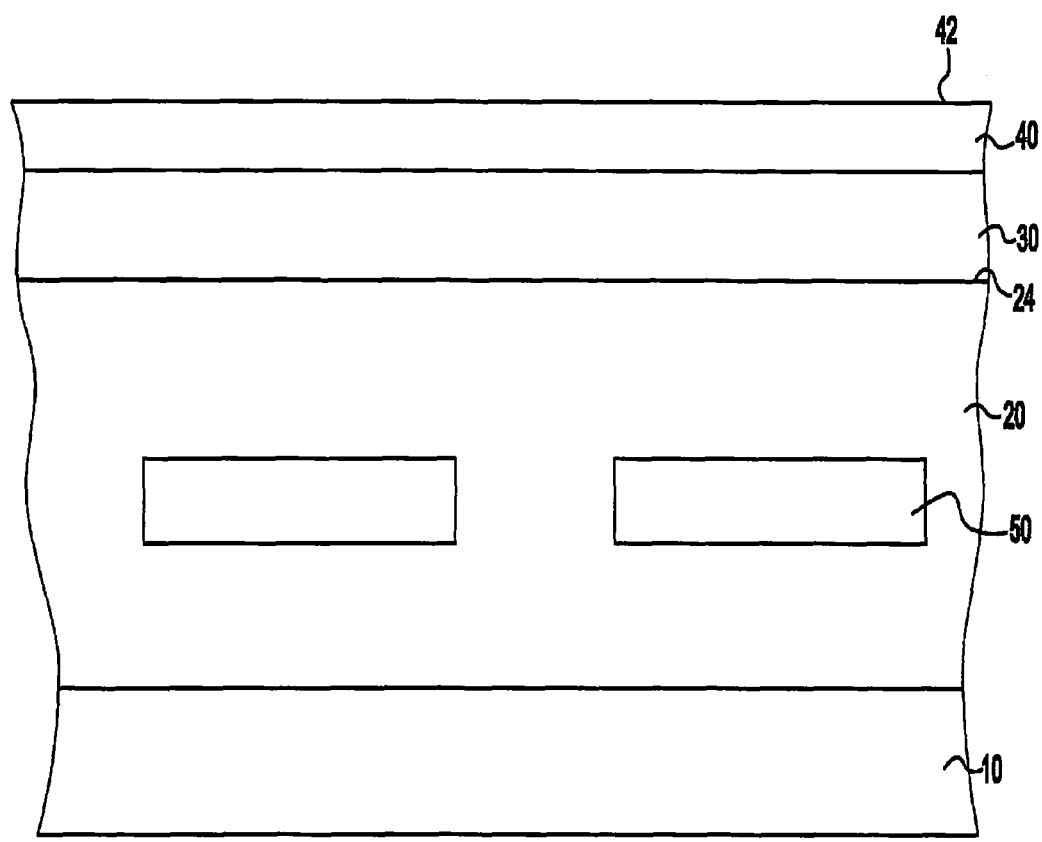
FIG. 5 illustrates a cross-section of the structure after formation of an additional drift sub-layer, and respective channel and source layers.

As described with respect to FIG. 5, an additional drift sub-layer having a thickness in a range of about 0.3 μm to 2.0 μm and having n-type conductivity is thereafter epitaxially grown on upper surface 28 and buried regions 50 shown in FIG. 4, so as to complete formation of drift layer 20. This additional drift sub-layer may have a dopant concentration in a range of about $1\times10^{14}$ cm$^{-3}$ to $2\times10^{17}$ cm$^{-3}$. Thereafter, channel layer 40 having a thickness in a range of about 0.2 μm to 1 μm and having p-type conductivity is epitaxially grown on upper surface 24 of drift layer 20. Channel layer 30 may have a dopant concentration in a range of about $1\times10^{15}$ cm$^{-3}$ to $5\times10^{17}$ cm$^{-3}$. Aluminum or boron may be used as a p-type dopant. Subsequent thereto, source layer 40 having a thickness in a range of about 0.1 μm to 0.5 μm and having n-type conductivity is epitaxially grown on channel layer 30. Source layer 40 may have a dopant concentration of at least about $1\times10^{18}$ cm$^{-3}$. Nitrogen or phosphorous may be used as the n-type dopant. These above noted layers may be epitaxially grown using well-known techniques.

Figure 6:
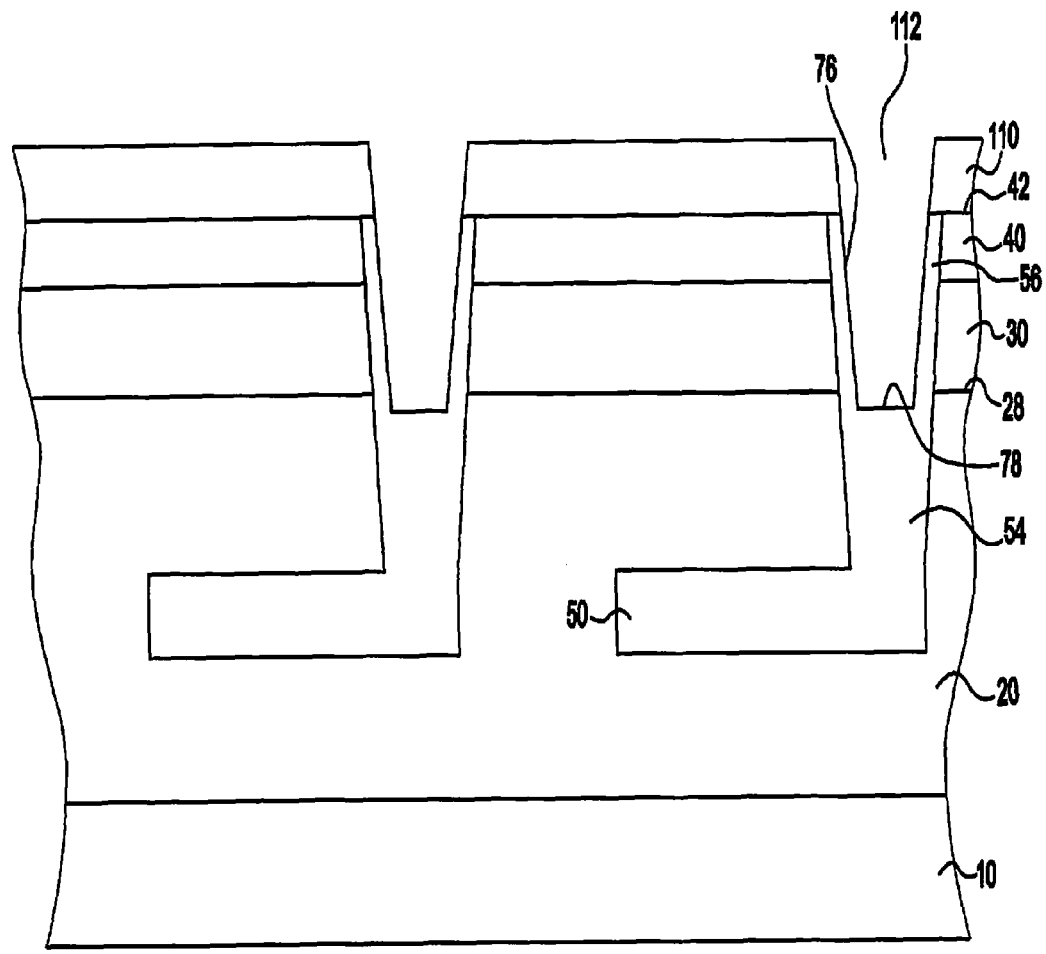
FIG. 6 illustrates a cross-section of the structure after formation of a conductive via through the device to the buried region, and formation of a contact trench embedded within the conductive via.

As described with respect to FIG. 6, oxide mask 110 is subsequently patterned on upper surface 42 of source layer 40 as having openings or windows 112 using standard photolithographic techniques. The structure is subsequently etched using a dry etching technique such as reactive ion etching (RIE) using oxide mask 110, to form contact trenches 76 that extend through source layer 40 and channel layer 30, into drift layer 20. That is, bottom surfaces 78 of contact trenches 76 are shown as disposed below upper surface 28 of drift layer 20. Thereafter, ion implantation is carried out through openings 112 in oxide mask 110 to form conductive vias 54 having p-type conductivity and which extend downward from contact trenches 76 to be in contact with respective peripheral areas of buried regions 50. This ion implantation to form conductive vias 54 is made at close to zero Implantation angle, and as a result side-wall implantation is dictated by the side-wall angle which must be appropriately chosen. The p-type dopant is thus implanted laterally into the wall of trenches 76 so that narrow sections 56 of conductive vias 54 form a continuous p-region along the sides of trenches 76 from source layer 40 through channel layer 30 and drift layer 20. In other words, trenches 76 are separated in a lateral direction from source layer 40, channel layer 30 and drift layer 20 by narrow section 56 of p-type conductivity material.

The dopant concentration of conductive vias 54 may be similar to the dopant concentration of buried regions 50. Oxide mask 110 is then removed, and an anneal process is subsequently carried out at a temperature of about 1700° C. or higher.

Figure 7:
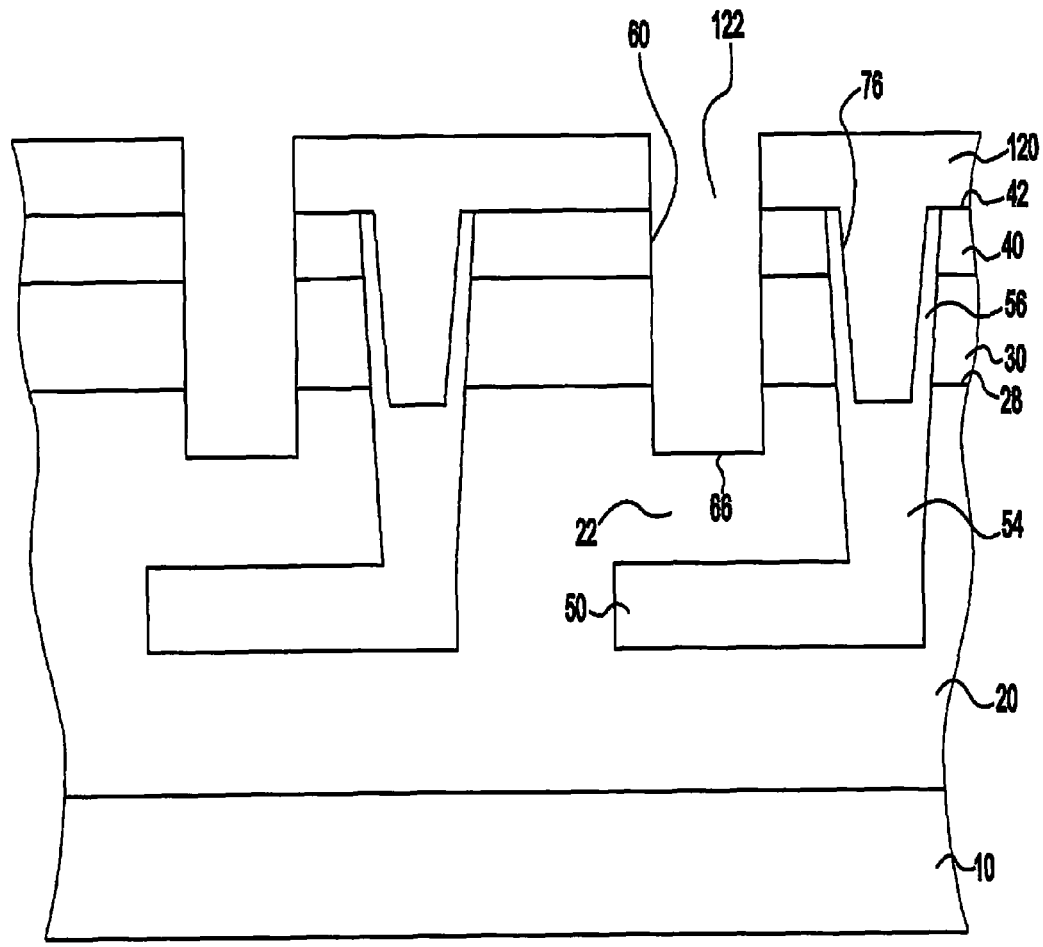
FIG. 7 illustrates a cross-section of the structure after formation of a UMOSFET trench through the source and channel regions, and into the drift region.

As described with respect to FIG. 7, another oxide mask or layer 120 is subsequently patterned on upper surface 42 of source layer 40 as having openings or windows 122. Oxide layer 120 is formed so as to fill contact trenches 76. The structure is subsequently etched using a dry etching technique such as RIE with oxide layer 120 as a mask, to form trenches 60 that extend from upper surface 42 of source layer 40, through source layer 40 and channel layer 30, into drift region 20. Trench bottoms 66 are within drift layer 20, and are thus disposed lower than upper surface 28 of drift layer 20. Trenches 60 are located above buried regions 50. Shallow regions 22 of drift layers 20 are respectively disposed intermediate between trench bottoms 66 and buried regions 50.

Figure 8:
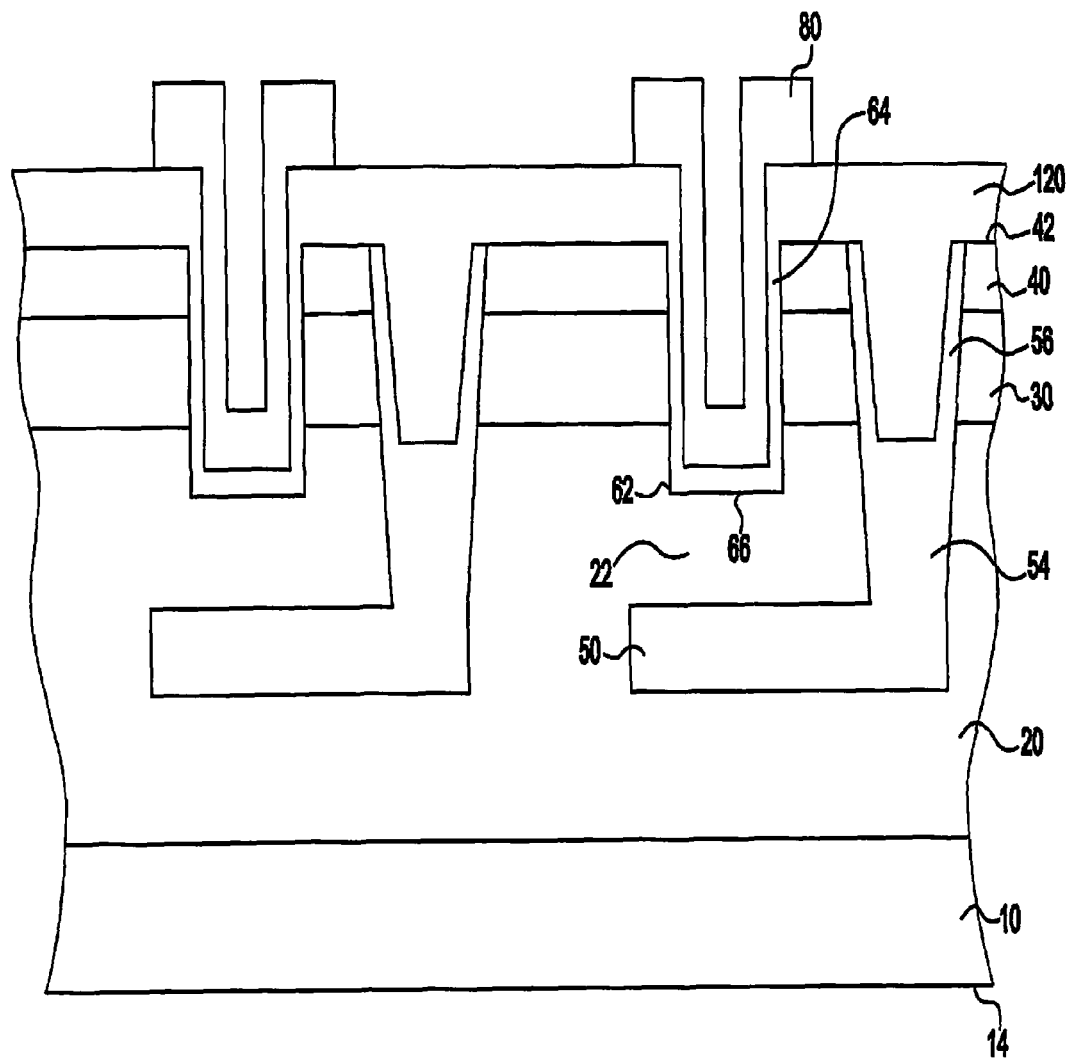
FIG. 8 illustrates a cross-section of the structure after formation of gate oxide and gate contacts within the UMOSFET trench.

As shown in FIG. 8, oxide layer 120 remains on upper surface 42 of source layer 40. The structure is thermally oxidized to form gate insulator 64 within trenches 60 as covering the sidewalls and bottom surfaces 66 of trenches 60. Alternatively a combination of a thin thermal oxidation and a deposited oxide using a technique such as Low Pressure CVD (LPCVD) may be used. Gate oxide 64 may have a thickness in the range of about 50 nm. Thereafter, a layer of polysilicon is deposited over the entire surface of the structure on oxide layer 120 and thermal oxide 64 within trenches 60. A mask is then patterned on the polysilicon layer, and the polysilicon layer is subsequently etched by RIE, for example, to form polysilicon gates 80 within trenches 60. Thereafter, oxide layer 120 is etched to be removed from over and within contact trenches 76 using an additional mask made of photoresist for example, using standard photolithographic technology, thus exposing contact trenches 76. A metal such as Ni, a metal stack such as Ni/Al, or a metal alloy such as TiW is then deposited over bottom surface 14 of substrate 10, and over the upper surface of the structure on oxide layer 120 and polysilicon gates 80, and to entirely fill contact trenches 76 and the corresponding openings in oxide layer 120 above contact trenches 76. The contact metal is subsequently etched using standard photolithographic and etching techniques as would be understood by one of ordinary skill, so that the metal remains on the entirety of surface 14 of substrate 10 as drain contact 90, and also remains within contact trenches 76 and directly there above as source contacts 70 including embedded portions 74. The portions of oxide layer 120 in FIG. 8 that remain on upper surface 42 of source layer 40 are indicated by reference numeral 68 in FIG. 1.

As noted previously, the shape and sizes of the elements have been exaggerated for purposes of explanation. For example, trenches 60 in FIG. 1 may have a width in the lateral or x-direction of about 2 μm. Buried regions 50 may extend in the lateral or x-direction at least about 1 μm past trench corners 62 on both sides of the UMOSFETs.

Although the present invention has been described in detail, the scope of the invention should not be limited by the corresponding description and figures. Also, the concepts described above should be applicable as well for the case where the conductivity types of channel layer 30 and buried region 50 are reversed to be n-type, and the conductivity types of source layer 40, drift layer 20 and substrate 10 are reversed to be p-type. In this alternative case, the potentials as applied to the gate contact, the source contact and the drain contact would be inverted, as would be understood by one of ordinary skill. Also, the structure has been described wherein source layer 40, channel layer 30, and drift layer 20 are 4H crystal type layers of silicon carbide. However, in alternative embodiments these layers may all be 6H crystal type layers of silicon carbide, or may all be 15R crystal type layers of silicon carbide. Also, these above noted layers may in the alternative have the C-faces as the top faces. These various changes and modifications of the embodiments, as would become apparent to one of ordinary skill, should be considered as within the spirit and scope of the invention.

What is claimed is:

1. A semiconductor device comprising:
   a drift layer of a first conductivity type;
   a channel layer of a second conductivity type on the drift layer, the second conductivity type opposite the first conductivity type;
   a source layer of the first conductivity type on the channel layer;
   a source contact extending on the source layer;
   a trench extending through the source layer and the channel layer, and into the drift layer, so that a bottom of the trench is within the drift layer;
   a gate electrode within the trench;
   a buried region of the second conductivity type within the drift layer, the buried region extending laterally to include a portion directly underneath the trench so that a shallow region of the drift layer is between the bottom of the trench and the buried region; and
   a conductive via electrically connecting the source contact to the buried region.

2. The semiconductor device of claim 1, wherein the drift, channel and source layers are silicon carbide epitaxial layers.

3. The semiconductor device of claim 1, wherein the conductive via is of the second conductivity type and the source contact is embedded into an upper surface of the conductive via, and wherein the source contact embedded within the conductive via is surrounded by material of the second conductivity type and thereby separated from the source and channel layers.

4. The semiconductor device of claim 3, wherein the source contact is a metal.

5. The semiconductor device of claim 1, wherein the first conductivity type is n-type conductivity and the second conductivity type is p-type conductivity.

6. The semiconductor device of claim 1, comprising a plurality of additional conductive vias separated from each other and each electrically connecting the source contact to the buried region.

7. The semiconductor device of claim 1, wherein the buried region is an implanted region.

8. The semiconductor device of claim 1, wherein the gate electrode is comprised of polysilicon.

9. A grid U-shape Metal Oxide Semiconductor Field Effect Transmitter (UMOSFET) comprising:
   a drift layer of a first conductivity type;
   a channel layer of a second conductivity type on the drift layer, the second conductivity type opposite the first conductivity type;
   a source layer of the first conductivity type on the channel layer;
   a source contact having a plurality of source contact fingers extending on the source layer substantially parallel with respect to each other;
   a plurality of trenches extending substantially parallel with respect to the plurality of source contact fingers, and through the source layer and the channel layer into the drift layer, so that bottoms of the plurality of trenches are within the drift layer;
   a plurality of gate electrodes respectively within the plurality of trenches;
   a plurality of buried regions of the second conductivity type within the drift layer, the plurality of buried regions respectively extending laterally to include a portion directly underneath the plurality of trenches so that shallow regions of the drift layer are between the bottoms of the plurality of trenches and the plurality of buried regions; and
   conductive vias electrically connecting the plurality of source contact fingers to the plurality of buried regions.

10. The grid UMOSFET of claim 9, wherein the drift, channel and source layers are silicon carbide epitaxial layers.

11. The grid UMOSFET of claim 9, wherein the conductive vias are of the second conductivity type and the plurality of source contact fingers are embedded into an upper surface of respective ones of the conductive vias, and wherein the plurality of source contact fingers embedded within the conductive vias are surrounded by material of the second conductivity type and thereby separated from the source and channel layers by portions of the conductive vias.

12. The grid UMOSFET of claim 11, wherein the source contact is a metal.

13. The grid UMOSFET of claim 9, wherein the first conductivity type is n-type conductivity and the second conductivity type is p-type conductivity.

14. The grid UMOSFET of claim 9, wherein each respective one of the plurality of source contact fingers are electrically connected to the plurality of buried regions by a plurality of the conductive vias.

15. The grid UMOSFET of claim 9, wherein the plurality of buried regions are implanted regions.

16. The grid UMOSFET of claim 9, wherein the plurality of gate electrodes are comprised of polysilicon.

17. A semiconductor device comprising:
   a plurality of semiconductor layers;
   a trench Metal Oxide Semiconductor Field Effect Transistor (MOSFET) disposed within the plurality of semiconductor layers, the trench MOSFET comprising a trench for a gate contact;
   a long channel Junction Field Effect Transistor (JFET) including a buried region within a lowermost layer of the plurality of semiconductor layers, the buried region extending laterally to include a portion directly underneath the trench of the trench MOSFET so that a shallow region of the lowermost layer is between the trench of the trench MOSFET and the buried region; and
   the buried region of the long channel JFET is electrically coupled to a source potential applied to the trench MOSFET.

18. The semiconductor device of claim 17, wherein the plurality of semiconductor layers are silicon carbide epitaxial layers.

19. The semiconductor device of claim 17, further comprising:
   a source contact;
   a conductive via extending through the plurality of semiconductor layers, and electrically connecting the source contact and the buried region; and
   a portion of the source contact is embedded within the conductive via, the embedded portion of the source contact is separated from the plurality of semiconductor layers by the conductive via.

20. A semiconductor device comprising:
a plurality of semiconductor layers;
a trench Metal Oxide Semiconductor Field Effect Transistor (MOSFET) disposed within the plurality of semiconductor layers, the trench MOSFET comprising a trench for a gate contact;
a buried region within a lowermost layer of the plurality of semiconductor layers, the buried region extending laterally to include a portion directly underneath the trench of the trench MOSFET so that a shallow region of the lowermost layer is between the trench of the trench MOSFET and the buried region; and
the buried region is electrically coupled to a source potential applied to the trench MOSFET.

21. The semiconductor device of claim 20, wherein the plurality of semiconductor layers are silicon carbide epitaxial layers.

22. The semiconductor device of claim 20, further comprising:
a source contact;
a conductive via electrically connecting the buried region to the source contact; and
a portion of the source contact is embedded within the conductive via, the embedded portion of the source contact is separated from the plurality of semiconductor layers by the conductive via.

* * * * *